(12) United States Patent
Hirakata et al.

(10) Patent No.: US 10,312,468 B2
(45) Date of Patent: *Jun. 4, 2019

(54) LIGHT EMITTING DEVICE, ELECTRONIC APPLIANCE, AND METHOD FOR MANUFACTURING LIGHT EMITTING DEVICE

(71) Applicant: Semiconductor Energy Laboratory Co., Ltd., Atsugi-shi, Kanagawa-ken (JP)

(72) Inventors: Yoshiharu Hirakata, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,964

(22) Filed: Dec. 27, 2017

(65) Prior Publication Data

US 2018/0182994 A1    Jun. 28, 2018

Related U.S. Application Data

(60) Continuation of application No. 15/353,804, filed on Nov. 17, 2016, now Pat. No. 9,859,523, which is a
(Continued)

(30) Foreign Application Priority Data

Dec. 26, 2003    (JP) ................... 2003-433025

(51) Int. Cl.
    *H01J 1/62*    (2006.01)
    *H01L 51/52*   (2006.01)
(Continued)

(52) U.S. Cl.
    CPC ........ *H01L 51/525* (2013.01); *H01L 27/0248* (2013.01); *H01L 27/3211* (2013.01);
    (Continued)

(58) Field of Classification Search
    USPC ................. 313/498, 504, 506, 512
    See application file for complete search history.

(56) References Cited

U.S. PATENT DOCUMENTS 6,062,461 A    5/2000  Sparks et al.
6,717,052 B2   4/2004  Wang et al.
(Continued)

FOREIGN PATENT DOCUMENTS

EP    1246509 A     10/2002
JP    11-040347 A   2/1999
(Continued)

Primary Examiner — Vip Patel
(74) Attorney, Agent, or Firm — Fish & Richardson P.C.

(57) ABSTRACT

To provide a light emitting device that has a structure in which a light emitting element is sandwiched by two substrates to prevent moisture from penetrating into the light emitting element, and a method for manufacturing thereof. In addition, a gap between the two substrates can be controlled precisely. In the light emitting device according to the present invention, an airtight space surrounded by a sealing material with a closed pattern is kept under reduced pressure by attaching the pair of substrates under reduced pressure. A columnar or wall-shaped structure is formed between light emitting regions inside of the sealing material, in a region overlapping with the scaling material, or in a region outside of the sealing material so that the gap between the pair of substrates can be maintained precisely.

16 Claims, 11 Drawing Sheets

Related U.S. Application Data continuation of application No. 14/704,064, filed on May 5, 2015, now Pat. No. 9,502,680, which is a continuation of application No. 13/868,228, filed on Apr. 23, 2013, now Pat. No. 9,030,097, which is a continuation of application No. 12/869,903, filed on Aug. 27, 2010, now Pat. No. 8,432,097, which is a division of application No. 11/017,888, filed on Dec. 22, 2004, now Pat. No. 7,792,489.

(51) Int. Cl.

| | |
|---|---|
| H01L 27/32 | (2006.01) |
| H01L 51/56 | (2006.01) |
| H01L 33/52 | (2010.01) |
| H01L 27/02 | (2006.01) |
| H01L 51/00 | (2006.01) |
| H01L 51/50 | (2006.01) |

(52) U.S. Cl.
CPC ...... *H01L 27/3244* (2013.01); *H01L 27/3248* (2013.01); *H01L 33/52* (2013.01); *H01L 51/0024* (2013.01); *H01L 51/5012* (2013.01); *H01L 51/5206* (2013.01); *H01L 51/5221* (2013.01); *H01L 51/5237* (2013.01); *H01L 51/5246* (2013.01); *H01L 51/5259* (2013.01); *H01L 51/5284* (2013.01); *H01L 51/5293* (2013.01); *H01L 51/56* (2013.01); *H01L 51/0005* (2013.01); *H01L 2227/323* (2013.01); *H01L 2251/305* (2013.01); *H01L 2251/5323* (2013.01); *H01L 2251/566* (2013.01)

(56) References Cited

U.S. PATENT DOCUMENTS

| | | | |
|---|---|---|---|
| 6,833,668 | B1 | 12/2004 | Yamada et al. |
| 6,952,078 | B1 | 10/2005 | Guenther |
| 6,992,439 | B2 | 1/2006 | Yamazaki et al. |
| 6,995,893 | B2 | 2/2006 | Kobayashi |
| 7,034,451 | B2 | 4/2006 | Senbonmatsu |
| 7,097,527 | B2 | 8/2006 | Matsuoka |
| 7,112,115 | B1 | 9/2006 | Yamazaki et al. |
| 7,173,371 | B2 | 2/2007 | Pang et al. |
| 7,662,011 | B2 | 2/2010 | Yamazaki et al. |
| 2002/0125817 | A1 | 9/2002 | Yamazaki et al. |
| 2002/0158574 | A1 | 10/2002 | Wolk et al. |
| 2003/0042852 | A1 | 3/2003 | Chen |
| 2003/0067268 | A1 | 4/2003 | Matsuoka |
| 2003/0206332 | A1 | 11/2003 | Yamazaki et al. |
| 2004/0069017 | A1 | 4/2004 | Li et al. |
| 2004/0150319 | A1 | 8/2004 | Tomimatsu et al. |
| 2004/0169920 | A1 | 9/2004 | Uehara et al. |
| 2005/0102827 | A1 | 5/2005 | Tseng et al. |
| 2006/0011136 | A1 | 1/2006 | Yamazaki et al. |

FOREIGN PATENT DOCUMENTS

| | | |
|---|---|---|
| JP | 11-327448 A | 11/1999 |
| JP | 2000-173766 A | 6/2000 |
| JP | 2001-093661 A | 4/2001 |
| JP | 2001-203076 A | 7/2001 |
| JP | 2002-099042 A | 4/2002 |
| JP | 2002-151252 A | 5/2002 |
| JP | 2002-252089 A | 9/2002 |
| JP | 2002-280169 A | 9/2002 |
| JP | 2002-299042 A | 10/2002 |
| JP | 2002-299044 A | 10/2002 |
| JP | 2002-324666 A | 11/2002 |
| JP | 2003-025779 A | 1/2003 |
| JP | 2003-077658 A | 3/2003 |
| JP | 2003-157967 A | 5/2003 |
| JP | 2003-173868 A | 6/2003 |
| JP | 2003-243154 A | 8/2003 |
| JP | 2003-317934 A | 11/2003 |
| JP | 2003-332047 A | 11/2003 |

LIGHT EMITTING DEVICE, ELECTRONIC APPLIANCE, AND METHOD FOR MANUFACTURING LIGHT EMITTING DEVICE

CROSS-REFERENCE TO RELATED APPLICATIONS

This application is a continuation of U.S. application Ser. No. 15/353,804, filed Nov. 17, 2016, now allowed, which is a continuation of U.S. application Ser. No. 14/704,064, filed May 5, 2015, now U.S. Pat. No. 9,502,680, which is a continuation of U.S. application Ser. No. 13/868,228, filed Apr. 23, 2013, now U.S. Pat. No. 9,030,097, which is a continuation of U.S. application Ser. No. 12/869,903, filed Aug. 27, 2010, now U.S. Pat. No. 8,432,097, which is a divisional of U.S. application Ser. No. 11/017,888, filed Dec. 22, 2004, now U.S. Pat. No. 7,792,489, which claims the benefit of a foreign priority application filed in Japan as Serial No. 2003-433025 on Dec. 26, 2003, all of which are incorporated by reference.

BACKGROUND OF THE INVENTION

1. Field of the Invention

The present invention relates to an organic light emitting element comprising an anode, a cathode, and a layer containing an organic compound that emits light by being applied with an electric field (hereinafter, referred to as an electroluminescent layer), and a light emitting device using the same. In particular, the invention relates to an electronic appliance mounted with a light emitting display device, which comprises a TFT and an organic light emitting element, as a component part.

In the present specification, a light emitting device indicates an image display device, a light emitting device, a light source (including a lighting device), and the like. The light emitting device further includes all of a module in which a light emitting device is attached with a connector, e.g., an FPC (flexible printed circuit), a TAB (tape automated bonding) tape, or a TCP (tape carrier package); a module having a printed wiring board provided on an end of a TAB tape or a TCP; and a module in that a light emitting element is directly mounted with an IC (integrated circuit) by the COG (chip on glass) technique.

2. Description of the Related Art

In recent years, a research related to a light emitting device having an EL element as a self-luminous light emitting element has been activated. Such a light emitting device is also referred to as an organic EL display or an organic light emitting diode. The light emitting device has advantages of being high-speed response that is suitable for displaying moving images, low voltage, low power consumption drive, and the like. Therefore, the light emitting device has been attracting attention as a next generation display device such as a new generation cellular phone and personal digital assistance (PDA).

An EL material for forming an EL layer is very easily deteriorated. In particular, the EL material is easily deteriorated due to existence of oxygen or moisture, and therefore, the EL material had drawbacks in which luminance of a light emitting element is lowered and life thereof is shortened.

Conventionally, moisture etc. has been prevented from penetrating into a light emitting element as follows: the light emitting element is covered with a sealing can while an inert gas is filled in the interior of the sealing can and a drying agent is pasted therein.

The present applicant discloses a structure in which a pair of substrates is attached to each other with a sealing material and a portion surrounded by the sealing material is filled with a resin to encapsulate a light emitting element in patent document 1.

The present applicant further discloses a structure in which a pair of substrates is attached to each other by using a filler to encapsulate a light emitting element in patent document 2.

The present applicant still further discloses a light emitting element in which a columnar spacer is provide between a pair of substrates in patent document 3.

[Patent Document 1]: Japanese Patent Application Laid-Open No. 2001-203076
[Patent Document 2]: Japanese Patent Application Laid-Open No. 2001-93661
[Patent Document 3]: Japanese Patent Application Laid-Open No. 2000-196438

SUMMARY OF THE INVENTION

It is an object of the present invention to provide a light emitting device with a structure in which a light emitting element is sandwiched by two substrates to prevent moisture from penetrating into the light emitting element, and a method for manufacturing the same. It is another object of the invention to control a gap between the two substrates precisely.

In the invention, a substrate with a light emitting element formed thereon and a transparent sealing substrate are attached to each other under reduced pressure, columnar or wall-shaped structures are provided on one of or both the substrates to maintain a gap between the substrates.

The invention provides a light emitting device in which a pair of substrates is attached to each other under reduced pressure so that a sealed space surrounded by a sealing material with a closed pattern is kept under negative pressure. By keeping the sealed space under negative pressure purposely, the pair of substrates can be attached to each other more tightly. Since the sealed space is kept under negative pressure, the both substrates might be curved by being applied with pressure so that a gap between the substrates might be narrowed in the vicinity of the center of a pixel portion. When columnar or wall-shaped structures are provided in the pixel portion, however, the pressure applying to the substrates is dispersed, thereby preventing bending and cracking of the substrates. In particular, when large-size substrates are attached to each other, they are easily curved. In the case where light emitted from a light emitting element passes through the curved substrates, the angle of refraction is varied with location. According to the invention, however, bending of the substrates can be prevented by providing the columnar or wall-shaped structures, which permits favorable display.

Conventionally, since a sealing substrate has been attached to a substrate with a light emitting element formed thereon under atmospheric pressure, a sealed space surrounded by a sealing material has been kept under positive pressure. Therefore, the sealing material has been partly pushed out to be broken due to the pressure difference between the positive pressure and the atmospheric pressure. Since the positive pressure within the sealed space has been kept after the sealing step, the adhesiveness between the substrates has been reduced. When the sealed space has been kept under positive pressure, the both substrates have been curved mutually so that a gap between the substrates has been widened in the vicinity of the center of a pixel portion. In the case where the scaled space is formed to have a protruded shape like a scaling substrate that is partly cut by processing or a scaling can, since the sealed space has a large volume, the above-mentioned problems due to the pressure difference has not been not caused prominently.

In the invention, the columnar or wall-shaped structures are preferably provided in a portion where does not overlap with a light emitting region and elements such as a TFT. For example, the columnar or wall-shaped structures can be provided between light emitting regions inside of a scaling material, in a region overlapping with the sealing material, or in a region outside of the sealing material. The arrangement of the columnar or wall-shaped structures overlapping with the sealing material can improve the adhesiveness between the substrates and maintain a gap therebetween.

The sealing material may contain a gap material for maintaining a gap between the substrates (such as a filler (e.g., a fiber rod), and a fine particle (e.g., a silica spacer)). A pixel portion in which multiple light emitting elements are disposed, a driver circuit, and the periphery thereof on the substrate are surrounded with the sealing material. The sealing material is formed to have a closed pattern such as a square shape.

According to providing columnar or wall-shaped structures in a region outside of the sealing material, in the case where a plurality of pixel portions are formed on one substrate (so-called multiple pattern), pressure can be dispersed not only attaching substrates under reduced pressure but also dividing a pair of substrates into respective panels.

It is still another object of the invention to improve light extraction efficiency of light emitting elements by reducing a volume of the sealed space, narrowing a gap between substrates, and maintaining the gap therebetween. It is preferable that the sealed space be filled with a filler in which a difference in refractive index between the filler and the substrates is 0 or more and 0.7 or less, rather than an inert gas having a controlled dew point. When using a glass substrate with a refractive index of about 1.55, for example, a UV curing epoxy resin (#2500 Clear manufactured by Electro-Lite Corporation) having the refractive index of 1.50 may be used as the filler. The whole light transmittance can be increased by filling the filler with the refractive index that is different of those of the substrates in the range of 0 to 0.7 between the pair of substrates.

Meanwhile, in the case of a liquid crystal display device, there is a method for filling a liquid crystal between a pair of substrates under reduced pressure. In the method, since the liquid crystal exists in a space surrounded by the pair of substrates and a sealing material, and therefore, the liquid crystal display device does not have an airtight space where is not filled with the liquid crystal. In the liquid crystal display device, bending of the substrates is prevented to some extent by filling the liquid crystal therebetween. On the other hand, in a light emitting device, when a pair of substrates is attached to each other under reduced pressure, since a sealed space surrounded by the pair of substrates and a sealing material is kept under negative pressure, the pair of substrates is easily dent seriously. This results in serious fluctuation of the display. Therefore, when attaching the pair of substrates for the light emitting device, certain conditions has been required such that the scaled space is kept under almost atmospheric pressure or slight negative pressure.

When the filler is filled in a region surrounded by the sealing material, it is preferable that the filler be dropped inside the region surrounded by the sealing material, and two substrates be attached to each other under reduced pressure. When attaching the two substrates to each other under reduced pressure, the columnar or wall-shaped structures play an important role of maintaining a gap between the substrates precisely and dispersing pressure applied to the substrates so as to prevent cracking of the substrates.

Conventionally, since the substrates have been attached to each other under atmospheric pressure, it has been difficult to fill the filler in the region surrounded by the sealing material, which results in defects of mixing air bubbles therein or spilling the filler out of the region surrounded by the sealing material.

Since the filler filled in the space surrounded by the sealing material is cured in the light emitting device, it also serves as a spacer so that the cured filler can disperse pressure applied to the substrates efficiently to prevent cracking of the substrates.

The columnar or wall-shaped structures can be formed by patterning the following materials into a predetermined pattern: an inorganic material (e.g., silicon oxide, silicon nitride, and silicon oxynitride); a photosensitive or nonphotosensitive organic material (e.g., polyimide, acrylic, polyamide, polymide amide, resist, and benzocyclobutene); a SOG film obtained by application (such as an SiOx film containing alkyl group); or a lamination layer thereof. Also, the columnar or wall-shaped structures can be made from either a negative photosensitive organic material that is insoluble in etchant by light irradiation or a positive photosensitive organic material that is soluble in etchant by light irradiation.

Columnar or wall-shaped structures may contain a hygroscopic substance (e.g., calcium oxide, barium oxide, and the like) to function as a drying agent. The columnar or wall-shaped structures are orderly aligned in the pixel region, and therefore, they also serve as a drying agent that is aligned efficiently. Conventionally, since a treatment for pasting a drying agent has been complicated, when a large-size substrate is used for mass-production, a large-scale device for attaching a drying agent has been required.

In the case where a transparent electrode is used as an anode or a cathode of a light emitting element and a pair of substrates is made from a material having light transmitting properties, a light emitting display device that can display images on both a front surface and a back surface (hereinafter referred to as a dual emission type display device) can be provided. When forming the dual-emission type display device, it is preferable that columnar or wall-shaped structures and a filler be made from materials with light transmitting properties. Preferably, polarizing plates or circular polarizing plates are attached on the both surfaces through which light is emitted so as to improve the contrast.

According to one aspect of the invention, there is provided a light emitting device including a pixel portion with a plurality of light emitting elements, wherein each of the plurality of light emitting elements has a cathode, a layer containing an organic compound, and an anode between a pair of substrates, the pixel portion is provided over one of the pair of substrates, a columnar or wall-shaped structure is formed over at least one of the pair of substrates to maintain a gap between the pair of substrates, the pair of substrates is attached to each other by a sealing material with a closed pattern, and an airtight space surrounded by the pair of substrates and the sealing material is kept under reduced pressure.

According to another aspect of the invention, there is provided a light emitting display device including a pixel portion with a plurality of light emitting elements, wherein each of the plurality of light emitting elements has a cathode, a layer containing an organic compound, and an anode between a pair of substrates, the pixel portion is formed over one of the pair of substrates, a columnar or a wall-shaped structure is formed over at least one of the pair of substrates to maintain a gap between the pair of substrates, the pair of substrates is attached to each other by a sealing material with a closed pattern that surrounds the pixel portion, a region surrounded by the sealing material is filled with a filler, and difference in a refractive index between the pair of substrates in contact with the filler and the filler is 0 or more and 0.7 or less.

In the above aspects, the columnar or wall-shaped structure is disposed inside the sealing material, in a position overlapping with the sealing material, or in a region outside the sealing material.

The columnar or wall-shaped structure contains a hygroscopic substance.

The cathode and anode for each of the plurality of light emitting elements are conductive films with light transmitting properties, and formed of indium tin oxide alloy (ITO), indium oxide zinc oxide alloy ($In_2O_3$—ZnO), zinc oxide (ZnO), or indium tin oxide containing SiOx (ITSO).

A first polarizing plate is provided on one of the pair of substrates whereas a second polarizing plate is provided on another substrate. By providing the polarizing plates or circular polarizing plates, pure black display can be performed during non-light emitting state, thereby increasing the contrast.

The anode or cathode of each of the plurality of light emitting elements is electrically connected to a TFT.

According to still another aspect of the invention, there is provided a method for manufacturing a light emitting device that includes a pixel portion having a plurality of light emitting elements, wherein each of the plurality of light emitting elements includes a cathode, a layer containing an organic compound, and an anode between a pair of transparent substrates. The method further includes the steps of: forming the pixel portion over one of the pair of substrates; forming a columnar or wall-shaped structure over at least one of the pair of substrates; forming a sealing material with a closed pattern over at least one of the pair of substrates; and attaching the pair of substrates to each other under reduced pressure so that the sealing material is disposed to surround the pixel portion.

According to yet another aspect of the invention, there is provided a method for manufacturing a light emitting device that includes a pixel portion having a plurality of light emitting elements, wherein each of the plurality of light emitting elements includes a cathode, a layer containing an organic compound, and an anode between a pair of transparent substrates. The method further includes the steps of: forming the pixel portion over one of the pair of substrates; forming a columnar or wall-shaped structure over at least one of the pair of substrates; forming a sealing material with a closed pattern over at least one of the pair of substrates; dropping a filler inside a region surrounded by the sealing material; and attaching the pair of substrates under reduced pressure so that the sealing material is disposed to surround the pixel portion, wherein the region surrounded by the sealing material is filled with the fillet.

In the light emitting device of the invention, the method for driving screen display is not particularly limited. For example, a dot sequential driving method, a line sequential driving method, a surface sequential driving method, and the like may be used. The line sequential driving method is typically used, and a time division gray scale driving method or a surface area gray scale driving method may also be employed arbitrarily. Further, a source line of the light emitting display device may be input with either analog signals or digital signals. A driver circuit and the like may be designed arbitrarily according to the image signals.

Light emitting display devices using digital video signals are classified into one in which video signals are input to a pixel at a constant voltage (CV), and another one in which video signals are input to a pixel at a constant current (CC). The light emitting devices in which video signals are input to a pixel at a constant voltage (CV) are further classified into one in which a constant voltage is applied to a light emitting element (CVCV), and another one in which a constant current is supplied to a light emitting element (CVCC). The light emitting devices in which video signals are input to a pixel at a constant current (CC) is still classified into one in which a constant voltage is applied to a light emitting element (CCCV), and another one in which a constant current is supplied to a light emitting element (CCCC).

A protection circuit (e.g., a protection diode) may be provided in the light emitting device of the invention to inhibit electrostatic discharge damage.

The present invention can be applied regardless of a TFT structure. For example, a top-gate TFT, a bottom-gate (inverted-stagger type) TFT, staggered TFT, and the like can be employed. The invention is not particularly limited to a TFT with a single-gate structure, and therefore, a TFT with a multi-gate structure having multiple channel formation regions, e.g., a TFT with a double gate structure may be used.

A light emitting element may be electrically connected to either a p-channel TFT or an n-channel TFT. When a light emitting element is electrically connected to the p-channel TFT, the light emitting element may be formed as follows. A hole injecting layer, a hole transporting layer, a light emitting layer, and an electron transporting layer are sequentially laminated on an anode, and a cathode may be formed on the electron transporting layer. When a light emitting element is electrically connected to the n-channel TFT, the light emitting element may be formed as follows. An electron transporting layer, a light emitting layer, a hole transporting layer, and a hole injecting layer are sequentially laminated on a cathode, and an anode is formed on the hole injecting layer.

As an active layer of the TFT, an amorphous semiconductor film, a semiconductor film having a crystal structure, a compound semiconductor film having an amorphous structure, and the like may be used arbitrarily. As the active layer of the TFT, a semiamorphous semiconductor film (also referred to as a microcrystalline semiconductor film) can also be used. The semiamorphous semiconductor film has an intermediate structure between an amorphous structure and a crystal structure (also including a single crystal structure and a polycrystal structure), and a third condition that is stable in term of free energy, and further includes a crystalline region having a short range order along with lattice distortion.

Crystal grains with a size of 0.5 to 20 nm are contained in at least a part of the semiamorphous semiconductor film. Raman spectrum is shifted toward lower wavenumbers than 520 $cm^{-1}$. The diffraction peaks of (111) and (220), which are believed to be derived from Si crystal lattice, are observed in the semiamorphous semiconductor film by X-ray diffraction. The semiamorphous semiconductor film contains hydrogen or halogen of at least 1 atom % or more as a neutralizing agent for dangling bonds. The semiamorphous semiconductor film is formed by glow discharge decomposition with silicide gas (plasma CVD). As for the silicide gas, $SiH_4$, $Si_2H_6$, $SiH_2Cl_2$, $SiHCl_3$, $SiCl_4$, $SiF_4$ and the like can be used. The silicide gas may also be diluted with $H_2$, or a mixture of $H_2$ and one or more of rare gas elements selected from He, Ar, Kr, and Ne. The dilution ratio is set to be in the range of 1:2 to 1:1,000. The pressure is set to be approximately in the range of 0.1 to 133 Pa. The power frequency is set to be 1 to 120 MHz, preferably, 13 to 60 MHz. The substrate heating temperature may be set to be 300° C. or less, preferably, 100 to 250° C. With respect to impurity elements contained in the film, each concentration of impurities for atmospheric constituents such as oxygen, nitrogen, and carbon is preferably set to be $1\times10^{20}$ $cm^{-1}$ or less. In particular, the oxygen concentration is set to be $5\times10^{19}/cm^3$ or less, preferably, $1\times10^{19}/cm^3$ or less. The electron field-effect mobility $\mu$ of the TFT using the semiamorphous semiconductor film as its active layer is 5 to 50 $cm^2/Vsec$.

Further, the light emitting element (EL element) includes a layer containing an organic compound that generates electroluminescence by being applied with an electric field (hereinafter referred to as an EL layer), an anode, and a cathode. As electroluminescence generated in the organic compound, there are luminescence (fluorescence) upon returning to a ground state from an excited singlet state, and luminescence (phosphorescence) upon returning to a ground state from an excited triplet state. The light emitting display device manufactured according to the invention can be applicable in the case of using either fluorescence or phosphorescence.

The light emitting element (EL element) having an EL layer includes a structure in which the EL layer is sandwiched between a pair of electrodes. The EL layer usually includes a lamination structure. Typically, the EL layer is formed by laminating "a hole transporting layer, a light emitting layer, and an electron transporting layer".

The EL layer may also includes a lamination structure as follows: a hole injecting layer, a hole transporting layer a light emitting layer, and an electron transporting layer are laminated on an anode; or a hole injecting layer, a hole transporting layer, a light emitting layer, an electron transporting layer, and an electron injecting layer are laminated on an anode. A light emitting layer may be doped with a fluorescent pigment and the like. All of the above-mentioned layers may be made from low molecular weight materials or high molecular weight materials. A layer containing an inorganic material (such as silicon) may be used. Note that layers sandwiched between an anode and a cathode are collectively referred to as the EL layer throughout the present specification. The EL layer includes all of the above hole injecting layer, the hole transporting layer, the light emitting layer, the electron transporting layer, and the electron injecting layer.

According to the invention, when a pair of attached large-size substrates is divided into multiple panels for mass-production, a light emitting element is sandwiched by the two substrates while maintaining a constant gap between the substrates, so that ingress of moisture into the light emitting element can be prevented.

BRIEF DESCRIPTION OF THE DRAWINGS

In the accompanying drawings.

DETAILED DESCRIPTION OF THE INVENTION

Embodiment Modes of the invention will hereinafter be described.

Embodiment Mode 1

The present embodiment mode will explains a method for manufacturing a light emitting device in the case of the multiple pattern in which a pair of attached substrates is divided into multiple patterns (e.g., two pieces of panels are manufactured from a pair of attached substrates) with reference to FIGS. 1A to 1F.

Figure 1A:
FIG. 1A to 1F are cross sectional views showing manufacturing steps according to the invention (Embodiment Mode 1)

A second substrate 20 that will serve as a sealing substrate is prepared. Columnar spaces 15 are formed on the second substrate 20 (FIG. 1A). The columnar spacers 15 are formed by patterning a level film in predetermined portions. The height of the columnar spacers 15 is important, and determines a gap between two substrates. Although the columnar spacers are exemplified as structures for maintaining the gap therebetween, the spacers may have a wall-shaped structure or a grid-like structure, or a combination of such shapes.

The columnar spacers may contain a drying agent.

Figure 1B:
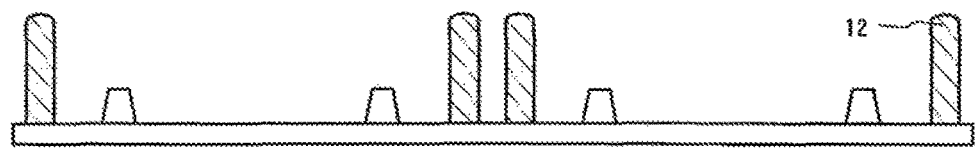

Patterns of a scaling material 12 is formed by using a dispenser device, a droplet discharging device (e.g., an ink jet device), and the like (FIG. 1B). The sealing material 12 may be added with a filler for maintaining the gap between the substrates. The sealing material 12 is formed to have a closed pattern such that a pixel portion with light emitting elements formed over a first substrate is surrounded by the sealing material when attaching the first and second substrates to each other.

Figure 1C:
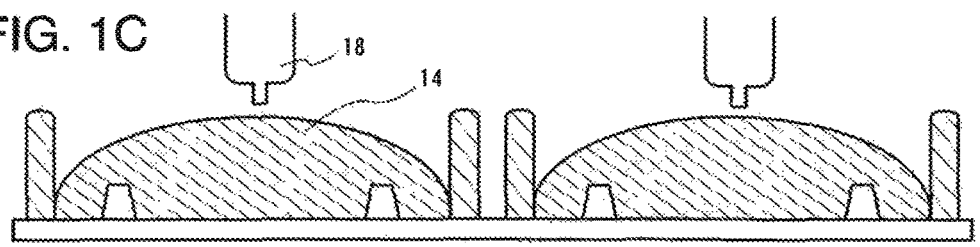

A filler 14 is dropped in a portion surrounded with the sealing material by using the dispenser device, the droplet discharging device (the ink jet device), and the like. In the embodiment mode, the filler 14 having lower viscosity than that of the sealing material 12 is dropped from a dispenser 18 under an inert atmosphere (FIG. 1C). The dropping amount is determined by calculating the volume of a scaled space (i.e., a space surrounded by the pair of substrates and the sealing material) in advance so as to drop the appropriate amount of the filler.

Figure 1D:
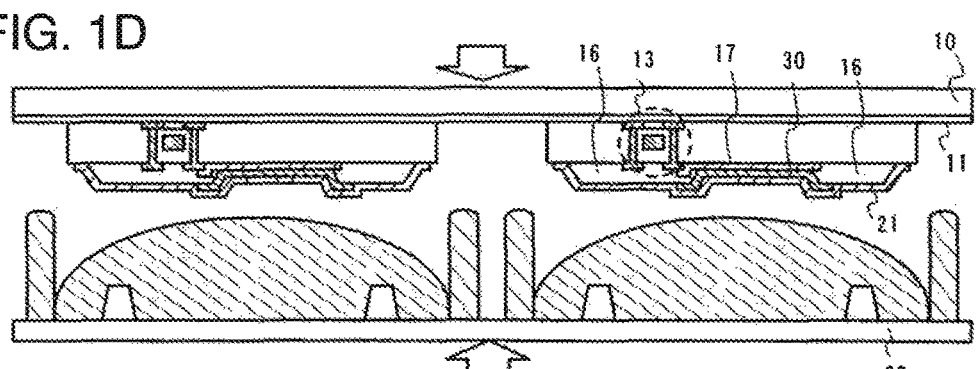

Subsequently, the second substrate 20 and a first substrate 10 with the light emitting elements formed thereon are attached to each other under reduced pressure (FIG. 1D). Since the light emitting elements are sensitive to moisture, the substrates are preferably attached to each other in an atmosphere with a dew point as low as possible.

In the first substrate 10, a TFT 13 is formed on a base insulating film 11 and an anode 17 of a light emitting element is connected to one of electrodes for the TFT 13. Ends of the anode 17 are covered with a partition wall 16 that is made from an insulating material. A layer 30 containing an organic compound is provided to be in contact with the anode 17. A cathode 21 is formed so as to cover the partition wall 16 and the layer 30 containing the organic compound. The light emitting element includes the anode 17, the layer 20 containing the organic compound, and the cathode 21 to form a light emitting region. The second substrate 20 is preferably attached to the first substrate 10 such that the columnar spacers 15 are not overlapped with the light emitting region and the TFT 13.

Figure 1E:
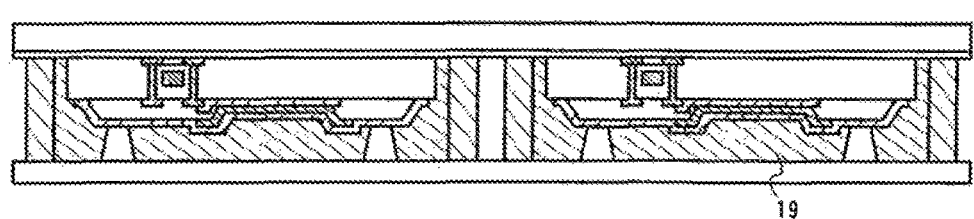
Figure 1F:
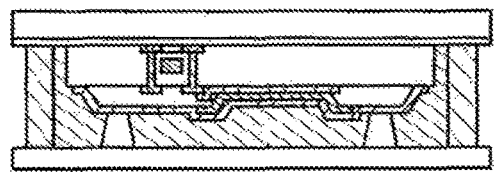
Figure 2:
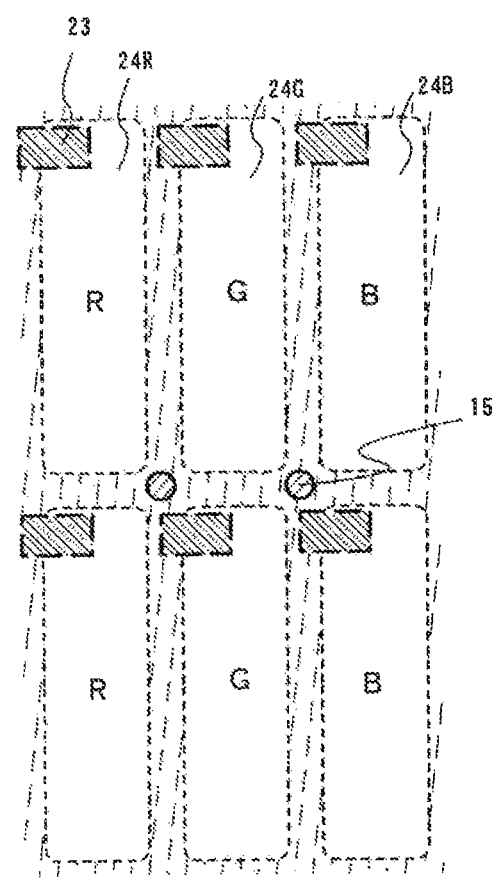
FIG. 2 is a top view showing a structure according to the invention (Embodiment Mode 1)

FIG. 2 is a top view showing an example of pixels upon attaching the pair of substrates. As shown in FIG. 2, it is preferable that the columnar spacers 15 be disposed such that they do not overlap with light emitting regions 24R, 24G, 24B, and element portions (including the TFT 13) 23, respectively. Note that portions identical to those in FIGS. 1A to 1F are denoted by same reference numerals in FIG. 2.

Figure 3:
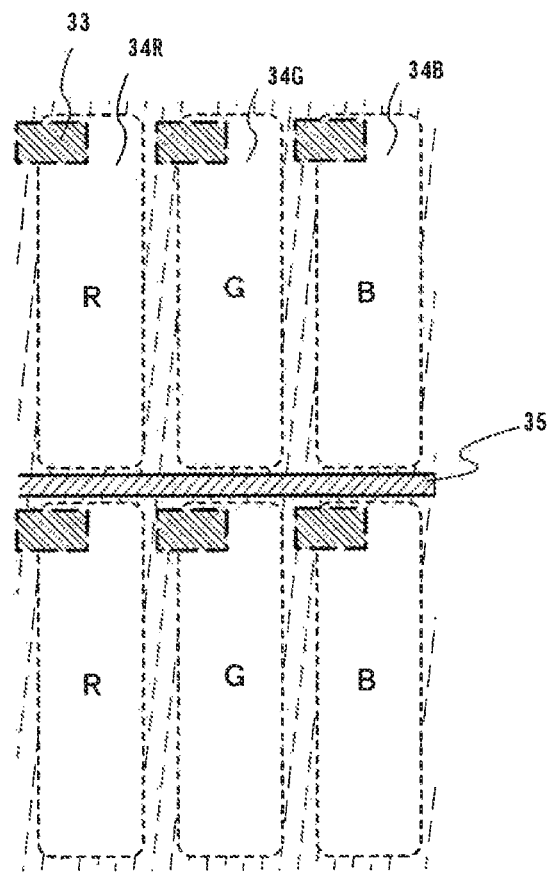
FIG. 3 is a top view showing a structure according to the invention (Embodiment Mode 1)

FIG. 3 shows an example in which a wall-shaped spacer 35 is provided as substitute for the columnar spacers. As shown in FIG. 3, the wall-shaped spacer 35 is disposed so as not to overlap light emitting regions 34R, 34G, 34B, and element portions (including TFTs) 33.

Figure 4:
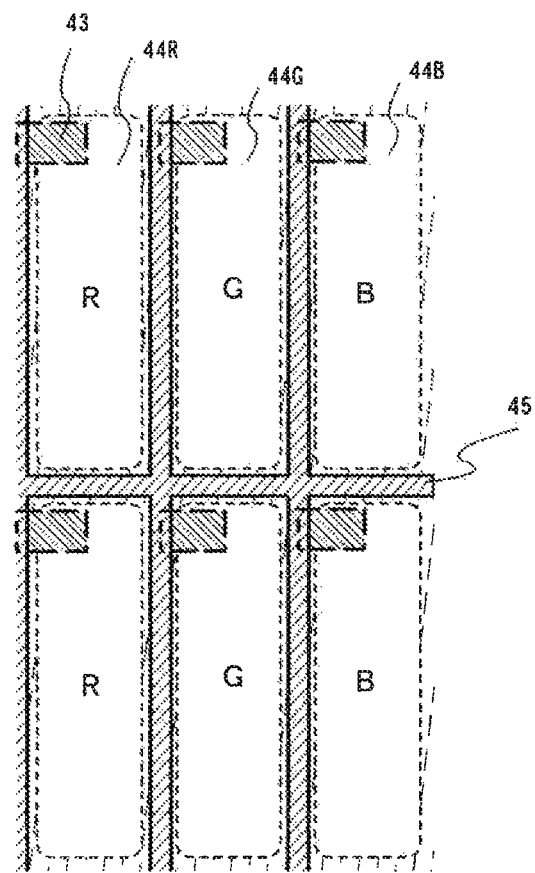
FIG. 4 is a top view showing a structure according to the invention (Embodiment Mode 1)

FIG. 4 shows an example in which a grid-like spacer 45 is provided in place of the columnar spacers. As shown in FIG. 4, the grid-like spacer 45 is disposed such that it does not overlap with light emitting regions 44R, 44G, and 44B while it partly overlaps with element portions (including TFTs) 43. In the case of forming the grid-like spacer 45, since it occupies a larger area as compared with the columnar and wall-shaped spacers, if pressure is applied to the pair of substrates, the pressure is dispersed. Therefore, the grid-like spacer may overlap the element portions partly. In this case, the light emitting regions 44R, 44G, 44B are partitioned by the grid-like spacer 45, respectively so that the light emitting elements are sealed more firmly. That is, a plurality of airtight spaces is further formed inside the sealed space surrounded by the sealing material.

When the second substrate 20 is attached to the first substrate 10 with the light emitting elements formed thereon, the partition wall (also referred to as a bank) 16 also serves as a structure for maintaining the gap between the substrates.

Note that although only one pixel is illustrated in FIGS. 1A to 1F for the sake of simplification, in fact, multiple pixels (n rows×m columns) are arranged.

Next, the sealing material 12 or the filler 19 is cured by heat treatment or irradiation with light so that the pair of attached substrates is fixed to each other (FIG. 1E). Thereafter, pressure within a processing chamber, which has been kept under reduced pressure, is gradually increased up to atmospheric pressure. Or, preferably, dummy patterns of a sealing material (with a dot shape) are provided outside of the patterns of the sealing material 12, and only the dummy patterns are cured with UV light. The pressure within the processing chamber, which has been kept under reduced pressure, is increased up to atmospheric pressure, and the patterns of the scaling material 12 are then cured entirely.

Upon increasing the pressure to the atmospheric pressure from reduced pressure 6 or upon attaching the pair of substrates, if pressure is applied to the substrates, bending and cracking of the substrates can be prevented because of the columnar spacers 15 and the partition wall 16, thereby maintaining the constant gap between the substrates in the entire pixel portion.

Afterwards, the attached first and second substrates 10, 20 are divided into two panels by using a cutting device such as a scriber device, a breaker device, and a roll cutter (FIG. 1F). To prevent cutting defects, another columnar spacers may be provided outside of the sealing material 12 prior to performing the dividing step. Thus, the two panels can be fabricated from the pair of substrates. Thereafter, FPCs are pasted to each of the panels by using a known method.

According to the above-mentioned steps, a light emitting device is achieved. The light emitting elements are sandwiched by the two substrates 10, 20 while maintaining a constant gap between the substrates, thereby preventing ingress of moisture into the light emitting elements.

Alternatively, after forming the cathode 21 over the first substrate 10 under reduced pressure, the first substrate can be attached to the second substrate 20 under reduced pressure without increasing the pressure within the processing chamber to the atmospheric pressure. Since the light emitting elements are sensitive to moisture, it is effective that the step of forming the layer containing the organic compound to the step of attaching the pair of substrates be carried out in an atmosphere with a dew point as low as possible.

Figure 9A:
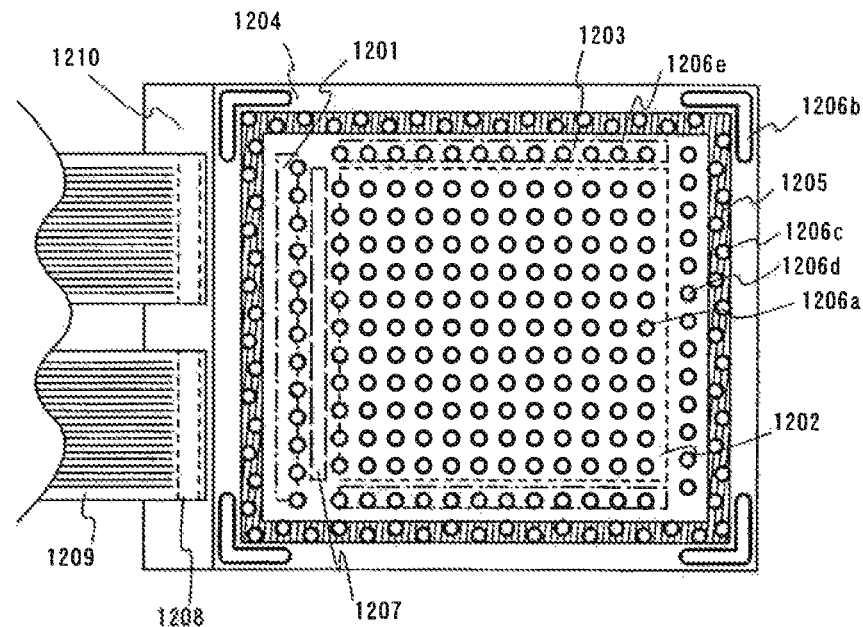
FIGS. 9A and 9B are top views showing arrangements of spacers.

FIG. 9A is a top view showing an example of the light emitting device thus manufactured. Reference numerals 1201, 1203 denoted by chained lines represent a source signal line driver circuit and a gate signal line driver circuit, respectively, whereas reference numeral 1202 denoted by a dotted line represents a pixel portion. Reference numeral 1207 denoted by a dotted line indicates a portion for connecting a cathode or an anode of a light emitting element to a wiring of a lower layer. Reference numeral 1204 represents a sealing substrate; and 1205, a sealing material. The interior portion surrounded by the sealing material 1205 is filled with a filler. Columnar spacers 1206c are provided in portions overlapping with the sealing material to improve the adhesiveness between the pair of substrates and maintain a gap therebetween. L-shaped spacers 1206b are disposed outside of the sealing material to prevent cracking of the substrates upon dividing. As substitute for the L-shape spacers, another columnar spacers may be provided outside of the sealing material to maintain the gap between the substrates, precisely. The columnar spacers 1206a, 1206d, and 1206e are disposed in the interior 16 portion surrounded by the sealing material 1205 to maintain the gap therebetween.

Reference numeral 1208 indicates terminal portions connecting to wirings for transmitting signals input in the source signal line driver circuit 1201 and the gate signal line driver circuit 1203. The terminal portions 1208 receive video signals and clock signals from FPCs (flexible printed circuits) 1209 that will be external connection terminals.

Embodiment Mode 2

A method for manufacturing a dual-emission type display device will be described with reference to FIG. 5.

A base insulating film is formed on a substrate 400. In order to extract light from the substrate 400 as a display screen, a substrate with a light transmitting property such as a glass substrate and a quartz substrate may be used as the substrate 400. A heat-resistant plastic substrate with a light transmitting property that can withstand a processing temperature can also be employed. A glass substrate is, herein, used as the substrate 400. The refractive index of the glass substrate is approximately 1.55.

As the base insulating film, a base film made from a silicon oxide film, a silicon nitride film, a silicon oxynitride film, and the like is formed. The base insulating film has light transmitting properties. Although the base insulating film has, herein, two-layer structure, it may have a single layer or two or more layers of the above insulating films. Note that the base insulating film is not particularly required.

A semiconductor layer is formed on the base insulating film. The semiconductor layer is formed as follows. A semiconductor film with an amorphous structure is formed by a known method (e.g., sputtering, LPCVD, and plasma CVD) and crystallized by a known crystallization method (e.g., laser crystallization, thermal crystallization, and thermal crystallization using a catalyst such as nickel). A crystalline semiconductor film thus obtained is patterned into a predetermined shape by using a first resist mask that is formed with use of a first photomask. The thickness of the semiconductor film is set to be 25 to 80 nm (preferably, 30 to 70 nm). A material for the crystalline semiconductor film is not particularly limited, and silicon or silicon-germanium (SiGe) alloy is preferably used.

A continuous wave laser may be used to crystallize the semiconductor film with the amorphous structure. When crystallizing the semiconductor film with the amorphous structure, in order to obtain large-size crystal grains, it is preferable to use a continuous wave solid-state laser and second to fourth harmonics of fundamental waves. Typically, a second harmonic (532 nm) or a third harmonic (355 nm) of an Nd:YVO$_4$ laser (fundamental wave with 1,064 nm) may be applied. In the case of using a continuous wave laser, laser beam emitted from a continuous wave YVO$_4$ laser with 10 W output power is converted in a harmonic by a nonlinear optical element. Alternatively, a YVO$_4$ crystal and a nonlinear optical element may be put in a resonator so as to be converted into a harmonic. Preferably, laser beam having a rectangular shape or an elliptical shape is formed on an irradiation surface by an optical system and irradiated to an object to be processed. At this time, an energy density of about 0.01 to 100 MW/cm$^2$ (preferably, 0.1 to 10 MW/cm$^2$) is required. The semiconductor film may relatively be moved with respect to the laser beam at a speed of about 10 to 2,000 cm/s and irradiated with it.

After removing the first resist mask, a gate insulating film covering the semiconductor layer is formed. The gate insulating film is formed by plasma CVD, sputtering, or thermal oxidation to have a thickness of 1 to 200 nm. As the gate insulating film, an insulating film made from a silicon oxide film, a silicon nitride film, a silicon oxynitride film, and the like is formed. The gate insulating film also has the light transmitting property. When a thin gate insulating film is formed by plasma CVD, the thin film can be obtained with good controllability by lowering the deposition rate. For example, in the case where an RF power is set to be 100 W, 10 kHz; pressure, 0.3 Torr, the flow rate of N$_2$O gas, 400 sccm; and the flow rate of SiH$_4$ gas, 1 sccm, a silicon oxide film can be formed at a deposition rate of 6 nm/min.

A conductive film with a thickness of 100 to 600 am is formed on the gate insulating film. For instance, the conductive film is, herein, formed by laminating a TaN film and a W film by sputtering. Although a lamination layer of the TaN film and the W film is used here, the present embodiment mode is not particularly limited to the structure. The conductive film may be formed of an element selected from Ta, W, Ti, Mo, Al, and Cu, a single layer of an alloy material or a compound material containing the above elements as its principal constituent, or a lamination thereof. In addition, a semiconductor film typified by a polycrystalline silicon film that is doped with an impurity element such as phosphorus may be used.

A second resist mask is next formed using a second photomask. The conductive film is dry-etched or wet-etched by using the second resist mask to form gate electrodes for TFTs 402R, 402G, and 402B.

After removing the second resist mask, a third resist mask is newly formed by using a third photomask. By using the resist mask, a first doping step for doping an impurity element that imparts n-type conductivity (typically, phosphorus or As) to a semiconductor at low concentration is carried out so as to form an n-channel TFT (not shown). The resist mask covers a region to be a p-channel TFT and the vicinity of the conductive layer In the first doping step, the semiconductor film is doped with the impurity element through the insulating film so that a low concentration impurity region is formed. One light emitting element is driven by using a plurality of TFTs. When one light emitting element is driven by only p-channel TFTs, the above first doping step is not required.

After removing the third resist mask, a fourth resist mask is newly formed by using a fourth photomask. By using the resist mask, a second doping step is performed to dope an impurity element that imparts a p-type conductivity (typically, boron) to the semiconductor film at a high concentration so that a p-channel TFT is formed. In the second doping step, the semiconductor film is doped with the impurity element through the gate insulating film so as to form a p-type high concentration impurity region.

After removing the fourth resist mask, a fifth resist mask is newly formed by using a fifth photomask. A third doping step is carried out to dope an impurity element that imparts an n-type conductivity (typically, phosphorus or As) to the semiconductor film at a high concentration so that an n-channel TFT (not shown) is formed. The resist mask covers a region to be the p-channel TFT and the vicinity of the conductive layer. In the third doping step, the semiconductor film is doped with the impurity element through the gate insulating film so as to form an n-type high concentration impurity region.

The fifth resist mask is removed. An insulating film containing hydrogen is formed. Thereafter, the impurity elements doped into the semiconductor layer are activated and hydrogenated. As the insulating film containing hydrogen, a silicon nitride oxide film (an SiNO film) is formed by PCVD. When the semiconductor film is crystallized by using a metal element promoting crystallization typified by nickel, gettering can be performed to reduce the nickel in a channel formation region at the same time of activating the impurity elements. The insulating film containing hydrogen indicates a first layer of an interlayer insulating film, and represents an insulating film containing silicon oxide with a light transmitting property.

Subsequently, a planarizing film, that will be a second layer of the interlayer insulating film, is formed. The planarizing film is formed of an inorganic material with the light transmitting property (such as silicon oxide, silicon nitride, and silicon oxynitride); a photosensitive or nonphotosensitive organic material with the light transmitting property (such as polyimide, acrylic, polyamide, polyimide amide, resist, and benzocyclobutene); or a lamination thereof. Also, the following films with the light transmitting properties can be used as the planarizing film: an insulating film made from an SiOx film containing alkyl group that is formed by application, e.g., an insulating film formed using silica glass, alkyl siloxane polymer, alkyl silsesquioxane polymer, hydrogenated silsesquioxane polymer, hydrogenated alkyl silsesquioxane polymer, and the like. As examples of siloxane polymers, there are a coating material for an insulating film such as #PSB-K1 and #PSB-K31 manufactured by Toray Industries, Inc. and a coating material for an insulating film such as #ZRS-5PH manufactured by Catalysts & Chemicals Industries Co., Ltd.

A third layer with a light transmitting property of the interlayer insulating film is formed. The third layer of the interlayer insulating film is formed as an etching stopper film to protect the planarizing film, which is the second layer of the interlayer insulating film, upon patterning transparent electrodes 403 in the subsequent step. When the transparent electrodes 403 are patterned, if the second layer of the interlayer insulating film can serve as an etching stopper film, the third layer is not required.

By using a sixth resist mask, contact holes are formed in the interlayer insulating film. The sixth resist mask is then removed, and a conductive film (TiN/Al/TiN) is formed. By using a seventh resist mask, the conductive film is etched (dry-etched using a mixed gas of $BCl_3$ and $Cl_2$) to form wirings (such as a source wiring and a drain wiring of the TFTs, and a power supply line). IN is one of materials that are well-adhered to a planarizing film with a high heat resistant property. In order to make good contact to a source or drain region of the TFTs, it is preferable that the N content of TIN be set to be less than 44%.

By using an eighth resist mask, the transparent electrodes 403, i.e., anodes of organic light emitting elements are formed with a thickness of 10 to 800 nm. The transparent electrodes 403 can be, for example, made from a transparent conductive material with a high work function (4.0 eV or more) such as indium tin oxide containing an Si element (ITSO), and IZO (indium zinc oxide) formed by mixing indium oxide and zinc oxide (ZnO) of 2 to 20%, in addition to indium tin oxide (ITO).

By using a ninth resist mask, an insulator (also referred to as a bank, a partition wall, a barrier, a embankment, etc.) covering the edges of the transparent electrodes 403 is next formed. The insulator is formed of a photosensitive or nonphotosensitive organic material (e.g., polyimide, acrylic, polyamide, polyimide amide, resist, or benzocyclobutene) or an SOG film (e.g., a SiOx film containing alkyl group) by application to have a thickness of 0.8 to 1.0 μm.

Layers 404, 405R, 405G, 405B, 406 containing organic compounds are formed by vapor deposition or application. To improve the reliability of the light emitting elements, degasification is preferably performed by vacuum heating prior to forming the layers 404 containing the organic compound. For example, prior to vapor depositing an organic compound material, a heat treatment is desirably performed at 200 to 300° C. under a reduced pressure atmosphere or an inert atmosphere so as to eliminate gases contained in the substrate. When the interlayer insulating film and the partition wall are formed of high heat resistant SiOx films, the heat treatment can be performed at a higher temperature (410° C.).

The first layers 404 containing the organic compound (first layers) are selectively formed on the transparent electrodes 403 using an evaporation mask by co-depositing molybdenum oxide (MoOx), 4,4'-bis[N-(1-naphthyl)-N-phenyl-amino]-biphenyl (α-NPD), and rubrene.

In addition to the MoOx, materials with excellent hole injecting properties such as copper phthalocyanine (CuPC), vanadium oxide (VOx), ruthenium oxide (RuOx), and tungsten oxide (WOx) can be used. In addition, a film formed by applying a polymer material with an excellent hole injecting property such as a solution containing poly(ethylene dioxythiophene) and poly(styrene sulfonate) (PEDOT/PSS) may be used as the first layers 404 containing the organic compound.

Hole transporting layers (second layers) are next formed on the first layers 404 containing the organic compound by selectively vapor depositing α-NPD with use of an evaporation mask. In addition to the α-NPD, it is possible to use materials having the excellent hole transporting properties typified by aromatic amine-based compounds such as: 4,4'-bis[N-(3-methylphenyl)-N-phenyl-amino]-biphenyl (abbreviation: TPD); 4,4',4"-tris(N,N-diphenyl-amino)-triphenylamine (abbreviation: TDATA); and 4,4',4"-tris[N-(3-methylphenyl)-N-phenyl-amino]-triphenylamine (abbreviation: MTDATA).

Subsequently, light emitting layers 405R, 405G, and 405B (third layers) are selectively formed. To form a full color display device, evaporation masks for respective luminescent colors (R, G, and B) are aligned to vapor deposit selectively.

As for the light emitting layer 405R emitting red light, materials such as $Alq_3$:DCM, and $Alq_3$:rubrene:BisDCJTM are used. As for the light emitting layer 405G emitting green light, materials such as $Alq_3$:DMQD (N,N'-dimethylquinacridone), and $Alq_3$:coumarin 6 are used. As for the light emitting layer 405B emitting blue light, materials such as α-NPD, and tBu-DNA are used.

Electron transporting layers (fourth layers) are next formed on the light emitting layers 405R, 405G, 405B by selectively vapor depositing $Alq_3$(tris(8-quinolinolate) aluminum using an evaporation mask. In place of the above-mentioned material, it is possible to use materials having superior electron transporting properties typified by metal complexes having quinoline skeleton or benzoquinoline skeleton such as tris(5-methyl-8-quinolinolate) aluminum (abbreviation: $Almq_3$), bis(10-hydroxybenzo[h]quinolinato) beryllium (abbreviation: $BeBq_2$), and bis(2-methyl-8-quinolinolate)-4-phenylphenolate-aluminum (abbreviation: BAlq), etc. Also, metal complexes having oxazole ligand or thiazole ligand such as bis[2-(2-hydroxyphenyl)-benzoxazolate] zinc (abbreviation: $Zn(BOX)_2$), and bis[2-(2-hydroxyphenyl)-benzothiazolate] zinc (abbreviation: $Zn(BTZ)_2$) can be used. In addition to the metal complexes, following materials can be used as the electron transporting layers because of their excellent hole transporting properties: 2-(4-biphenyl)-5-(4-tert-butylphenyl)-1, 3, 4-oxadiazole (abbreviation: PBD); 1, 3-bis[5-(p-tert-butylphenyl)-1, 3, 4-oxadiazole-2-yl] benzene (abbreviation: OXD-7); 3-(4-tert-butylphenyl)-4-phenyl-5-(4-biphenylyl)-1, 2, 4-triazole (abbreviation: TAZ); 3-(4-tert-butylphenyl)-4-(4-ethylphenyl)-5-(4-biphenylyl)-1, 2, 4-triazole (abbreviation: p-EtTAZ); bathophenanthroline (abbreviation: BPhen); bathocuproin (abbreviation: BCP); and the like.

Next, 4, 4'-bis(5-methylbenzoxazol-2-yl) stilbene (abbreviation: BzOs) and lithium (Li) are co-deposited to form an electron injecting layer (fifth layer) 406 on an entire of the substrate such that it covers the electron transporting layers and the insulator. Damages that might be caused by sputtering for forming a transparent electrode 407 later can be suppressed by using the benzoxazole derivative (BzOS). In addition to BzOs:Li, materials having excellent electron injecting properties such as alkali metal compounds and alkali earth metal compounds, e.g., $CaF_2$, lithium fluoride (LiF), and cesium fluoride (CsF) can be used. In addition, a mixture of $Alq_3$ and magnesium (Mg) can be used.

The transparent electrode 407, that is a cathode of the organic light emitting elements is formed on the fifth layer 406 to be 10 to 800 nm thick. Indium tin oxide including an Si element (ITSO), or indium zinc oxide (IZO) in which zinc oxide (ZnO) of 2 to 20% is mixed into indium oxide can be used for the transparent electrode 407 as well as indium tin oxide (ITO).

The light emitting elements are thus achieved. The materials for the anode, the layers containing organic compounds (first to fifth layers) and the cathode, each of which are included in the light emitting elements, are selected arbitrarily. The thicknesses thereof are also adjusted arbitrarily. It is desirable that the anode and the cathode be formed of the same material and have almost same thickness, preferably, a thin thickness of about 100 nm.

If necessary, a transparent protective layer (not shown) for preventing ingress of moisture is formed to cover the light emitting elements. A silicon nitride film, a silicon oxide film, or a silicon oxynitride film (an SiNO film (N>O in composition ratio) or an SiON film (N<O in composition ratio)) a thin carbon-based film (such as DLC film or a CN film), and the like, each of which can be obtained by sputtering or CVD, can be used.

A second substrate 408 is attached to the substrate 400 by using a sealing material that contains a gap material for maintaining a gap between the substrates (e.g., a filler (fiber rod) and a fine particle (e.g., silica spacer)). The second substrate 408 may also be formed of a light-transmitting glass substrate or quartz substrate.

Structures 410 for maintaining the gap between the substrates are formed over the second substrate 408.

A drying agent may be provided in the gap between the pair of substrates (inert gas), or a transparent scaling material (e.g., an ultraviolet curing or thermal curing epoxy resin) may be filled therebetween. By filling the transparent sealing material (with a refraction index of about 1.50) between the substrates, the whole light transmittance can be improved.

Figure 6:
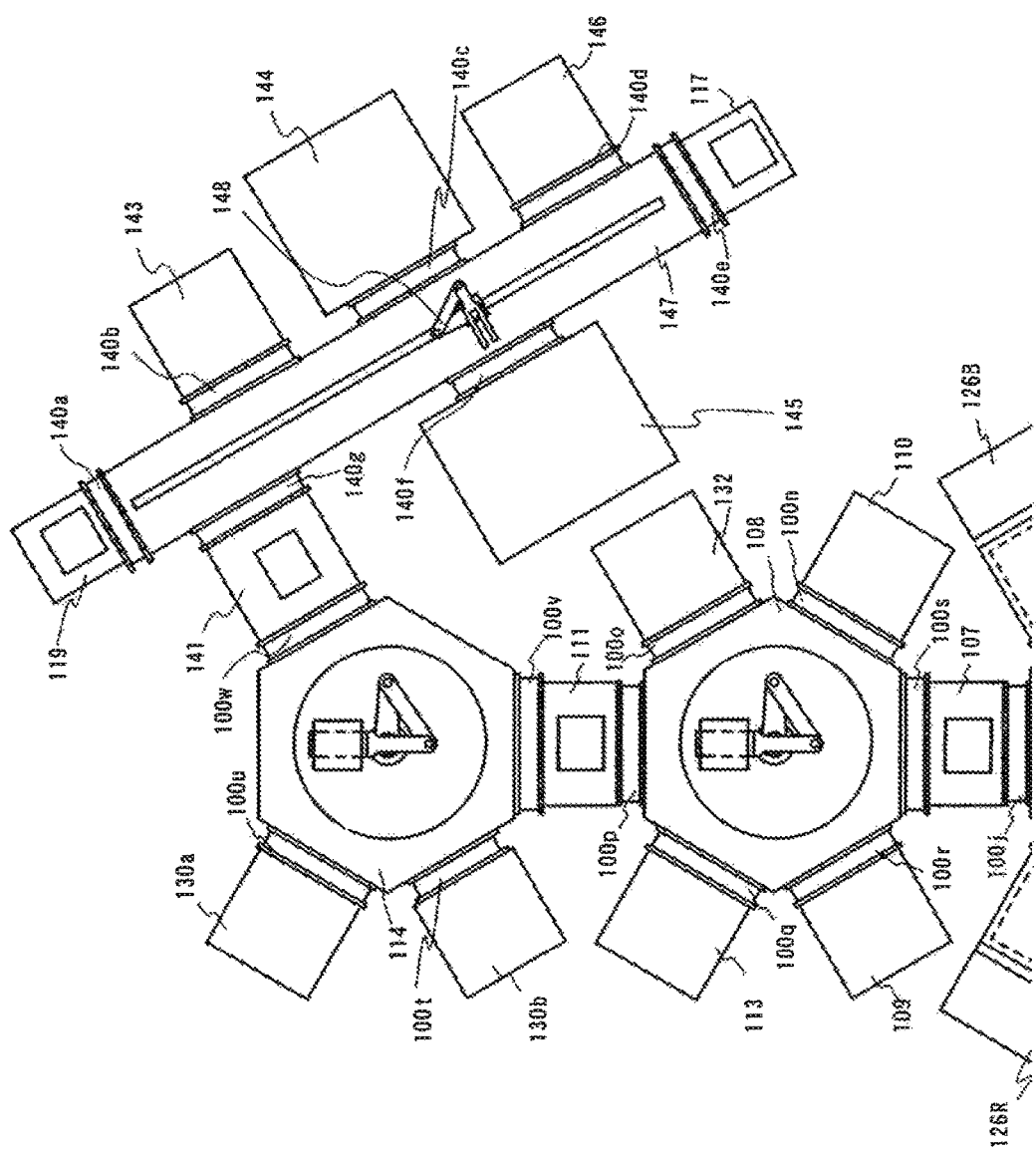
FIG. 6 is a part of a top view showing a manufacturing device (Embodiment Mode 2)

In the case of using a manufacturing device as shown in FIG. 6, after forming the cathode, a sealing step can be carried out under reduced pressure without increasing the pressure up to atmospheric pressure.

FIG. 6 shows an example of the manufacturing device in which a multichamber for performing vapor deposition of an organic compound layer etc. is united with chambers for performing the sealing treatment. The multichamber united with the chambers for performing the sealing treatment is intended to prevent ingress of impurities such as moisture and improve throughput.

In FIG. 6, the manufacturing device includes: gates 100j, 100n to 100w, 140a to 140f; an unloading chamber 119; transport chambers 108, 114, and 147; delivery chambers 107, 111, and 141; film formation chambers 109, 110, 113, and 132; chambers 126R, 126B for installing evaporation sources; substrate stock chambers 130a and 1301; a curing chamber 143; an attaching chamber 144; a chamber 145 for forming a sealing material; a pretreatment chamber 146; and a sealing substrate loading chamber 117.

A flow of performing the sealing step will briefly be explained below.

A first substrate, wherein a layer containing an organic compound, a cathode, and the like are formed on an anode, is introduced in the transport chamber 114, and stored in the substrate stock chambers 130a, 130b or transported to the delivery chamber 141. Preferably, the transport chamber 114, the substrate stock chambers 130a, 130b, and the delivery chamber 141 are kept under reduced pressure.

The first substrate transported to the delivery chamber 141 is further transported to the attaching chamber 144 by a transporting unit 148 that is installed in the transport chamber 147.

Columnar or wall-shaped structures have been provided on a second substrate that serves as a sealing substrate, in advance. The second substrate is introduced in the substrate loading chamber 117, and heated therein under reduced pressure so that degasification is performed. The second substrate is then transported into the pretreatment chamber 146 equipped with an UV irradiation mechanism by the transporting unit 148 that is installed in the transport chamber 147. In the pretreatment chamber, the surface of the second substrate is irradiated with ultraviolet light. The second substrate is next transported to the chamber 145 for forming a sealing material so as to form a sealing material thereon. The chamber 145 for forming a sealing material is equipped with a dispenser device or an ink-jet device. The chamber for forming a sealing material may also be provided with a baking mechanism or an UV irradiation mechanism to cure the sealing material temporarily. After curing the sealing material temporarily in the chamber 145 for forming a sealing material, a filler is dropped in a region surrounded by the sealing material.

The resultant second substrate is transported to the attaching chamber 144 by the transporting unit 148, as well as the first substrate.

In the attaching chamber 144, after depressurizing the chamber, the first and second substrates are attached to each other. At this moment, the first and second substrates are attached to each other by moving an upper plate or a lower plate up and down. Upon attaching the two substrates under reduced pressure, the gap between the substrates is kept precisely because of the columnar or wall-shaped structures that have been provided over the second substrate. The columnar or wall-shaped structures also serve to disperse pressure applied to the substrates so as to prevent breakage of the substrates.

Alternatively, the filler may be dropped in the region surrounded by the sealing material in the attaching chamber 144, instead of the chamber 145 for forming a sealing material.

Instead of reducing the pressure within the entire processing chamber, after making a space between the plates an airtight space by moving the upper and lower plates longitudinally, the airtight space therebetween may be depressurized by a vacuum pump connected to a hole that is provided in the lower plate. In such a way, the pressure within the airtight space can be reduced at short times since the volume to be depressurized is smaller as compared with the case of depressurizing the entire processing chamber.

Further, a transparent window may be provided in one of the upper and lower plates such that the scaling material is cured by being irradiated with light that passes through the transparent window while maintaining the gap between the upper and lower plates and attaching the substrates to each other. Or, dummy patterns of the sealing material are preferably provided outside of a pattern for the sealing material. After only the dummy patterns are cured with UV spot irradiation while maintaining the gap between the upper and lower plates and attaching the substrates to each other, the pressure within the processing chamber that has been kept under reduced pressure is increased up to atmospheric pressure. The entire pattern of the sealing material is then cured under atmospheric pressure. When the transparent window is provided in one of the upper and lower plates, however, since a light shielding mask (that is a mask for protecting light emitting elements from UV irradiation) etc. is formed in the subject substrates, it is difficult to position the subject substrates such that the position of the pattern for the sealing material is adjusted to a position of light that passes through the transparent window. The positioning accuracy of the sealing material with respect to the light irradiation position is hardly ensured. Accordingly, it is more preferable that only the dummy patterns of the sealing material be cured by UV spot irradiation. Note that a plurality of holes is formed in one of the upper and lower plates such that the dummy patterns are cured with UV light transmitting through the plurality of holes.

The pair of substrates, which is temporarily attached to each other, is transported to the curing chamber 143 by the transporting unit 148. In the curing chamber 143, the sealing material is completely cured by light irradiation or heat treatment.

The pair of substrates is thus transported to the unloading chamber 119 by the transporting unit 148. The pressure within the unloading chamber 119, which has been kept under reduced pressure, is increased up to atmospheric pressure, and then the pair of attached substrates is taken out therefrom. As a consequence, the sealing step is completed while maintaining the constant gap between the substrates.

Figure 7:
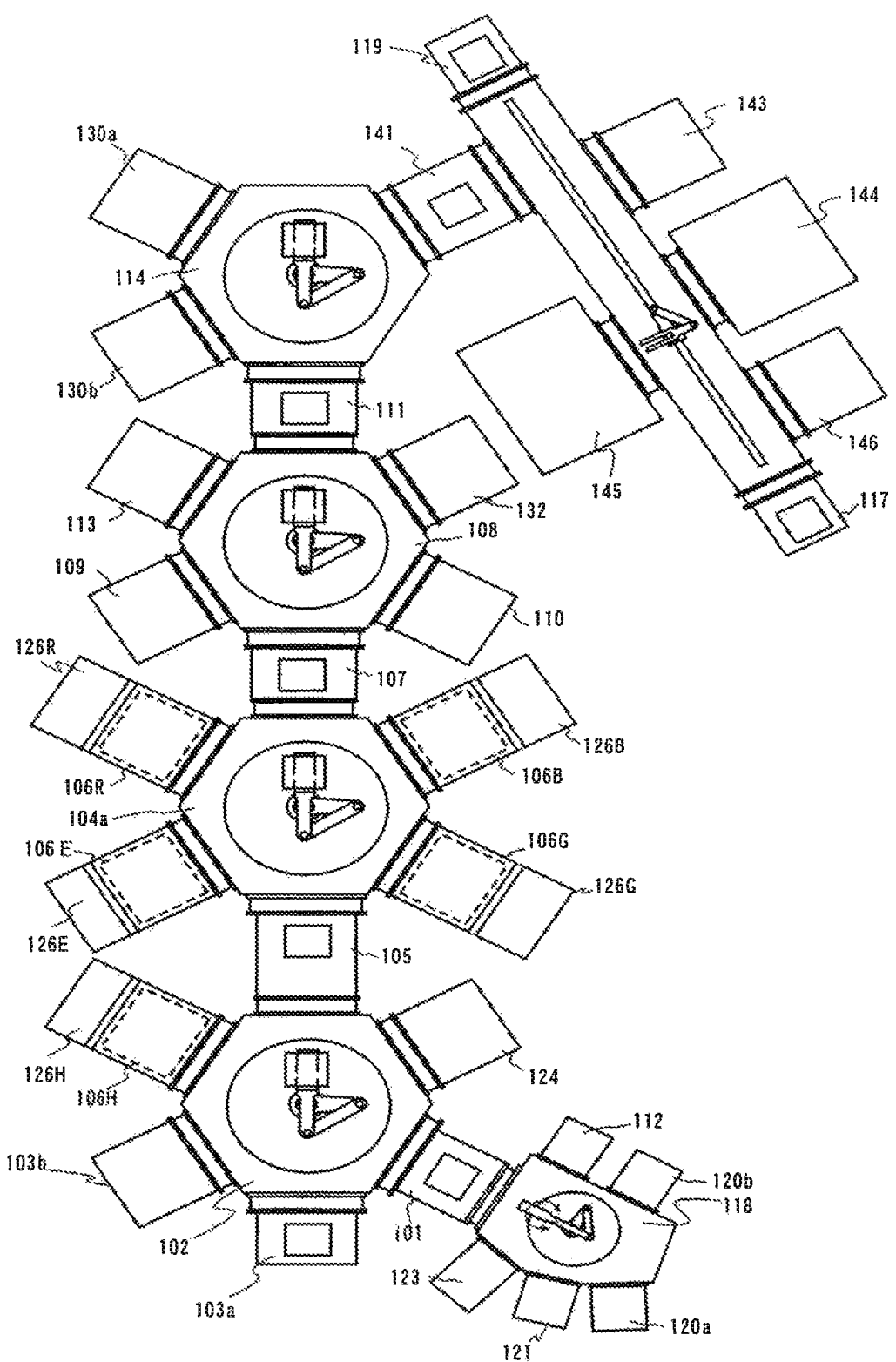
FIG. 7 is an overall view showing a manufacturing device (Embodiment Mode 2)

FIG. 7 is an overall view of the manufacturing device. In FIG. 7, identical portions to those in FIG. 6 are denoted by the same reference numerals. The manufacturing device as shown in FIG. 7 includes: transport chambers 102, 104$a$, 108, 114, and 118; delivery chambers 105, 107, and 111; a preparing chamber 101; a first film formation chamber 106H; a second film formation chamber 106B; a third film formation chamber 106O; a fourth film formation chamber 106R; a fifth film formation chamber 106E; other film formation chambers 109, 110, 112, 113, 131, and 132; chambers 126R, 126O, 126B, 126E, 126H for installing evaporation sources; pretreatment chambers 103$a$ and 103$b$; a mask stock chamber 124; substrate stock chambers 130$a$ and 130$b$; cassette chambers 120$a$ and 120$b$; and a tray installation stage 121. The transport chamber 104$a$ is provided with a transporting unit 104$b$ for transporting a substrate 104$c$, and the other transport chambers comprise such transporting units, respectively.

By utilizing the manufacturing device as illustrated in FIGS. 6 and 7, subject substrates can be processed successively from the vapor deposition step to the sealing step. Note that since a higher vacuum is required in vapor deposition as compared with that in the sealing step, upon transporting the subject substrates to a chamber for the sealing step from a chamber for vapor deposition, the vacuum is necessary to be reduced prior to performing the sealing step. In the sealing step, the vacuum is set to be 1 Pa or less such that sudden vaporization of a solvent, which is contained in the sealing material, is prevented. To prevent adhesion of moisture etc., an inert gas (e.g., nitrogen gas) having a controlled dew point is preferably filled in the chambers (including the delivery chamber, the processing chamber, the transport chamber, the film formation chamber, etc.), other than the cassette chambers 120$a$ and 120$b$; the transport chamber 118; the application chamber 112; a baking chamber 123; the tray installation stage 121; the unloading chamber 119; and the sealing substrate loading chamber 117. Preferably, pressure within such chambers is kept under reduced pressure.

Figure 5:
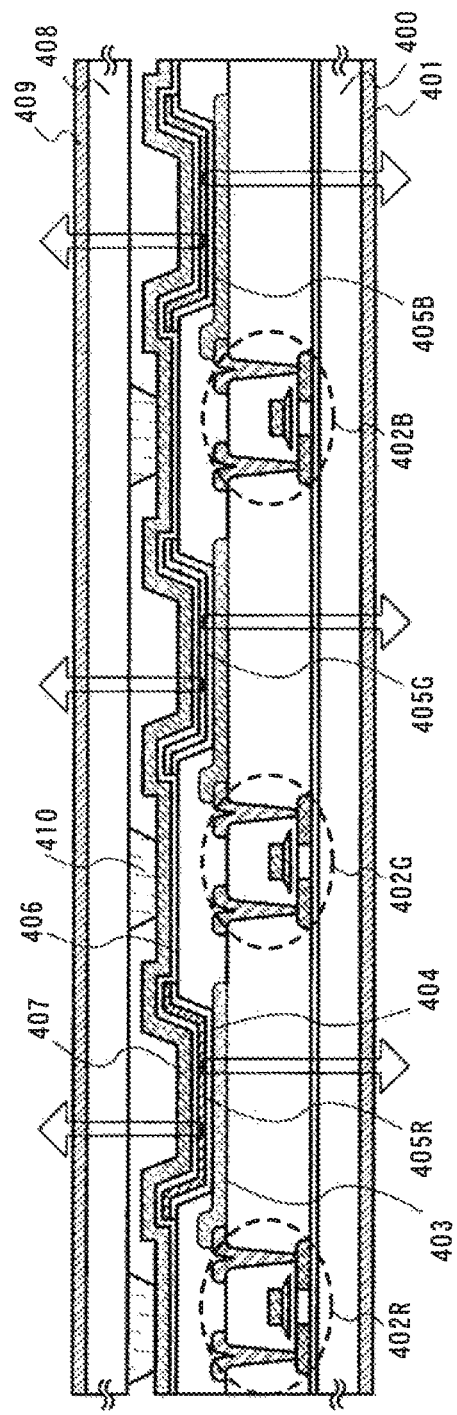
FIG. 5 is a cross sectional view according to the invention (Embodiment Mode 2)

As shown in FIG. 5, the transparent electrodes 403, 407 of the light emitting elements are made from the light transmitting materials so that each of the light emitting elements can emit light upward and downward denoted by arrows, i.e., through the both sides thereof.

Next, optical films (e.g., polarizing plates or circular polarizing plates) 401 and 409 are provided on the both sides of the first and second substrates to improve the contrast.

For instance, a $\lambda/4$ plate and a polarizing plate are sequentially disposed on the substrate 400 as the optical film 401, while a $\lambda/4$ plate and a polarizing plate are sequentially disposed on the second substrate 408 as the optical film 409.

As for another example, a $\lambda/4$ plate, a $\lambda/2$ plate, and a polarizing plate are sequentially disposed on the substrate 400 as the optical film 401, while a $\lambda/4$ plate, a $\lambda/2$ plate, and a polarizing plate are sequentially formed on the second substrate 408 as the optical film 409.

In the present invention, light emitted from the light emitting elements may be either monochromatic light or full color light of R, G, and B. When using a luminescent material for white color, for example, a color filter or a color filter together with a color conversion layer may be used so as to achieve full color display or area color display. Or, when using a luminescent material for blue color, a color conversion layer is used to achieve the full color display or the area color display.

As set forth above, a polarizing plate, a circular polarizing plate, or a combination thereof can be provided in accordance with the structure of the dual-emission type display device. As a consequence, fine black color can be displayed, thereby improving the contrast. In addition, reflected light can be prevented by forming a circular polarizing plate.

The present invention having the above-described structure will further be described in detail in the embodiment below.

Embodiment 1

Figure 8:
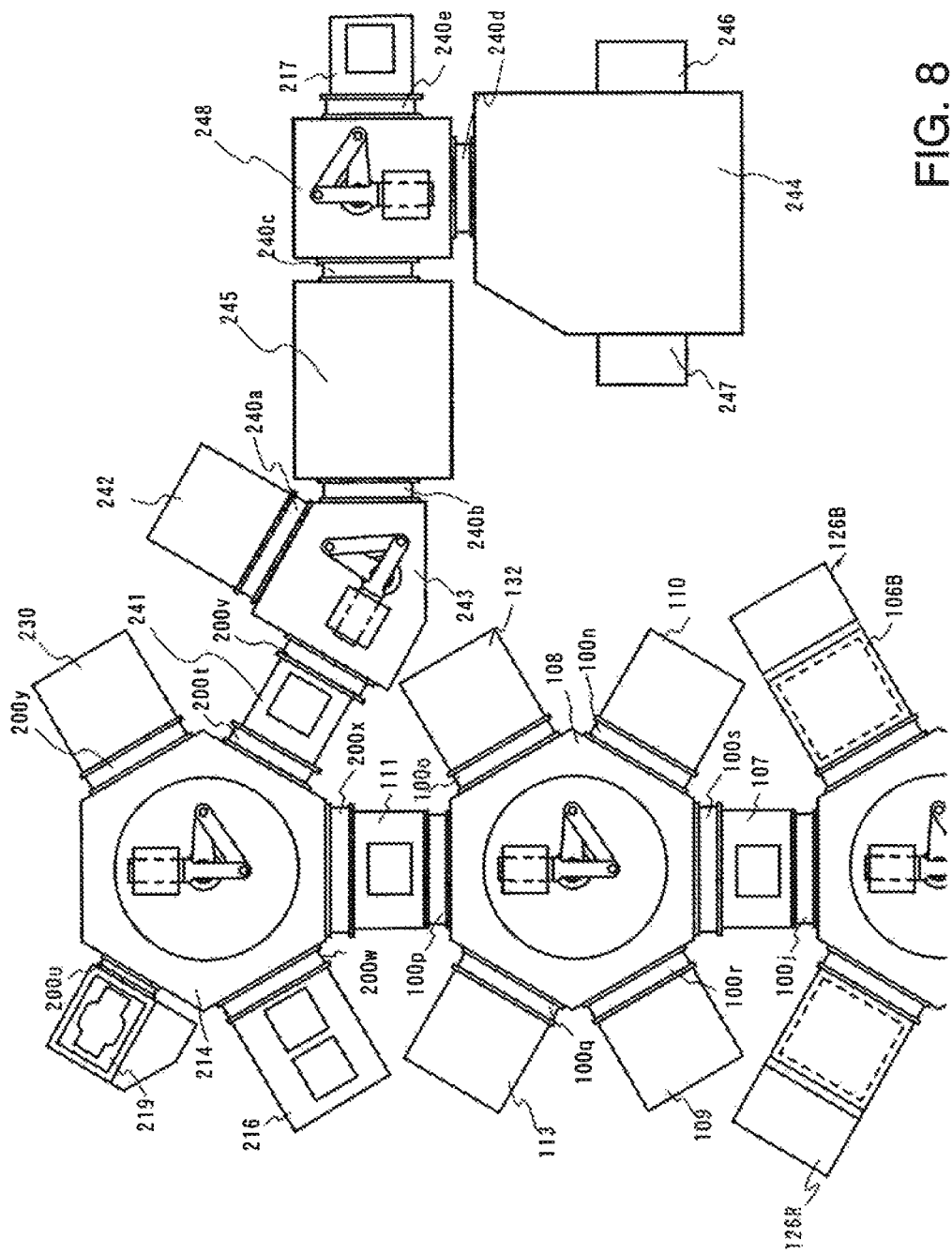
FIG. 8 is a top view showing a manufacturing device (Embodiment 1)

In the present embodiment, FIG. 8 shows an example of a manufacturing device that is partly different of those in FIGS. 6 and 7.

As well as FIG. 6 and FIG. 7, the manufacturing device as shown in FIG. 8 includes: the transport chamber 108 for transporting a substrate to the delivery chamber 111; the delivery chamber 107; the gates 100$j$, and 100$n$ to 100$s$; and the film formation chambers 109, 110, 113, and 132. In the embodiment, the portions identical to those in FIG. 6 and FIG. 7 will not be further explained for the sake of simplification. To prevent moisture from adhering, an inert gas (e.g., nitrogen gas) having a controlled dew point is preferably filled in the chambers (including the delivery chamber, the processing chamber, the transport chamber, a film formation chamber, etc.), other than an unloading chamber 219 and a sealing substrate loading chamber 217. Preferably, pressure in such chambers filled with an inert gas is kept under reduced pressure.

In FIG. 8, reference numerals 200$t$ to 200$x$, and 240$a$ to 240$e$ indicate gates, reference numerals 214, 243, and 248 indicate transport chambers, and a reference numeral 241 indicates a delivery chamber.

A flow of the sealing step will hereinafter be described briefly.

A first substrate in which a layer containing an organic compound, a cathode, etc. have been formed on an anode is introduced in the transport chamber 214 and transported to a sealing chamber 216.

Columnar or wall-shaped structures have been provided in advance over a second substrate that serves as a sealing substrate. The second substrate is introduced in the substrate loading chamber 217. The second substrate is heated under reduced pressure to perform degasification. Thereafter, the second substrate is transported to an attaching chamber 244 equipped with a mechanism for pasting a drying agent by a transporting robot that is installed in the transport chamber 248. In the attaching chamber 244, a drying agent that is attached on a tape is peeled off from the tape and pasted to the second substrate. The attaching chamber 244 further comprises a chamber 246 for providing a drying agent tape and a chamber 247 for gathering a tape that is separated from a drying agent.

The second substrate is transported to a chamber 245 for forming a sealing material via the transport chamber 248. In the chamber 245 for forming a sealing material, a pattern of a sealing material is formed over the second substrate. The chamber 245 for forming a sealing material is equipped with a dispenser device or an ink-jet device. The chamber 245 for forming a sealing material may further comprise a vacuum pump such that the pattern of the sealing material is formed under reduced pressure. A baking mechanism or an UV irradiation mechanism may be provided in the chamber 245 for forming a sealing material to cure the sealing material temporarily.

The second substrate is next transported to the baking chamber 242 via the transport chamber 243 so as to cure the sealing material formed over the second substrate temporarily. The baking chamber 242 may comprises a vacuum pump such that the sealing material is cured temporarily under reduced pressure. The second substrate on which the pattern of the sealing material is thus formed is transported to the sealing substrate stock chamber 230 via the delivery chamber 241 and stored therein. Or, the second substrate is directly transported to the sealing chamber 216.

The second substrate that is stored in the sealing substrate stock chamber 230 is transported to the scaling chamber 216.

In the sealing chamber 216, the first substrate is attached to the second substrate under reduced pressure. The substrates are attached to each other by moving an upper or lower plate longitudinally. The attached substrates are transported to the unloading chamber 219 via the transport chamber 214. The pressure within the unloading chamber 219 is gradually increased until it reaches the atmospheric pressure. Thereafter, the pair of attached substrates is taken out of the manufacturing device.

When the pair of attached substrates is exposed to outside air, a sealed space surrounded by the sealing material and the pair of substrates is kept under reduced pressure. In addition, since the columnar or wall-shaped structures are formed over the second substrate, a constant gap can be maintained between the substrates while the sealed space is kept under reduced pressure, without bending the pair of substrates.

In the embodiment, the drying agent is disposed in the sealed space surrounded by the pair of substrates and the sealing material. In this case, when attaching the substrates to each other, the gap between the substrates is maintained by the columnar or wall-shaped structures that are formed over the second substrate. The columnar or wall-shaped structures also have an important role to disperse pressure applied to the substrates so as to prevent cracking of the substrates. It is preferable that the drying agent be disposed so as not to overlap the columnar or wall-shaped structures.

Figure 9B:
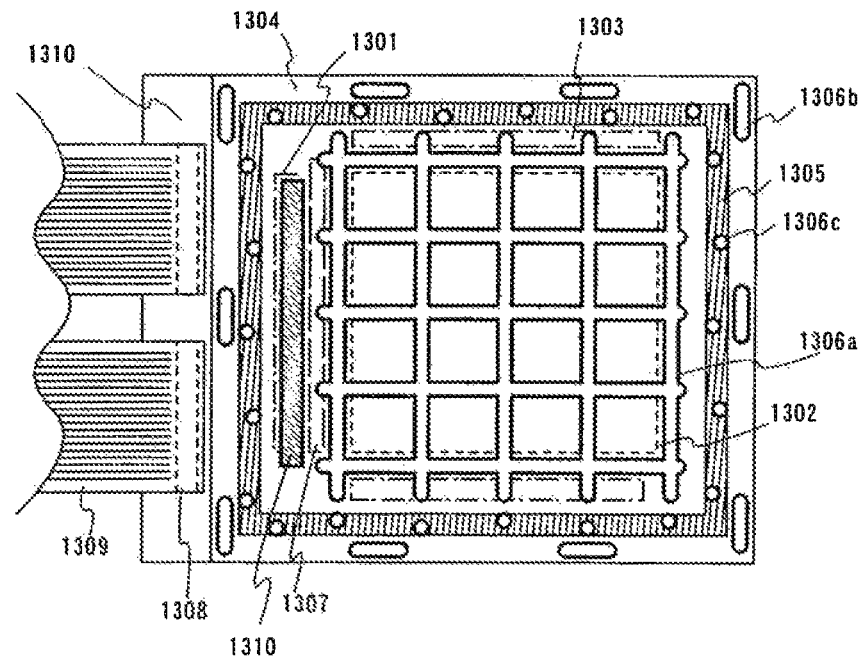

FIG. 9B is a top view of an example showing a light emitting device thus manufactured. Reference numeral 1301 denoted by a chained line represents a source signal line driver circuit; 1303, a gate signal line driver circuit; and 1302 denoted by a dotted line, a pixel portion. Reference numeral 1307 denoted by a dotted line indicates a connection region for connecting a cathode or an anode of a light emitting element to a wiring for a lower layer. Reference numeral 1304 indicates a sealing substrate; and 1305, a sealing material. An interior space surrounded by the scaling material 1305 is kept under reduced pressure and filled with an inert gas (typically, nitrogen gas). In the reduced-pressure space surrounded by the scaling material 1305, moisture is eliminated by the drying agent so that the inside of the space is dried completely. A grid-like spacer 1306a is disposed in the reduced-pressure space surrounded by the sealing material 1305 to maintain a gap between the substrates. A plurality of airtight spaces (4×4) is further provided by the grid-like spacer 1306a within the airtight space surrounded by the scaling material 1305. A plurality of wall-shaped spacers 1306b disposed outside of the sealing material prevents cracking of the substrates when the substrates are divided into multiple patterns.

Reference numeral 1308 indicates a terminal portion connecting to a wiring for transmitting signals input in the source signal line driver circuit 1301 and the gate signal line driver circuit 1303, and receives video signals and clock signals from an FPC (flexible printed circuit) 1309, which will be an external input terminal.

The embodiment can be freely combined with Embodiment Mode 1 or 2.

Embodiment 2

Various kinds of electronic appliances can be manufactured by being incorporated with a dual-emission type display device according to the present invention. Examples of the electronic appliances include: a camera such as a video camera and a digital camera; a goggle type display (a head-mounted display); a navigation system; an audio reproduction device (such as a car audio and an audio component system); a personal computer; a game machine; a portable information terminal (such as a mobile computer, a cellular telephone, a portable game machine, and an electronic book); an image reproduction device provided with a recording medium (typically, a device which can reproduce the recording medium such as a digital versatile disc (DVD) and display images thereof); and the like.

Figure 10A:
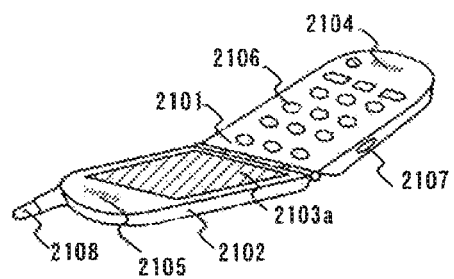
FIGS. 10A to 10D are diagrams showing electronic appliances mounted with light emitting devices according to the invention.

FIG. 10A shows an example of a folding cellular phone with a dual-emission type display device (a double-sided display panel) according to the invention.

Figure 10B:
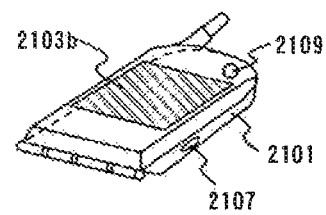

FIG. 10A is a perspective view showing the cellular phone that is opened, while FIG. 10B is a perspective view showing the cellular phone that is folded up. The folding cellular phone includes: a main body 2101; a housing 2102; display portions 2103a, 2103b; an audio input unit 2104; an audio output unit 2105; operation keys 2106; an external connection port 2107; an antenna 2108; an image pickup unit 2109; and the like.

The cellular phone as shown in FIGS. 10A and 10B includes the display portions 2103a and 2103b that display high-definition full color images, respectively. One panel (i.e., a dual-emission type panel) includes the display portions 2103a and 2103b. By using the dual-emission type panel, an electronic appliance with plural display screens can be reduced in size, thereby reducing weight and the number of component parts.

The dual-emission type display device as described in Embodiment Mode 1, Embodiment Mode 2, or Embodiment 1 can be used as the dual-emission type panel. An optical film (such as a polarizing plate, a λ/4 plate, a λ/2 plate) is properly disposed thereon.

The display portions 2103a and 2103b are identical in size and share same image signals. When an image is displayed on the display portion 2103a, the image is flipped horizontally on the display portion 2103b and the flipped image is displayed on the display portion 2103b, as well as the display portion 2103a. Usually, the user watches only images displayed on the display portion 2103b when folding up the cellular phone, and only images displayed on the display portion 2103a when opening the cellular phone. Therefore, images may be switched by flipping the images horizontally in accordance with the state of the cellular phone such that the user can recognize the images.

The cellular phone as shown in FIGS. 10A and 10B can photograph a still image and a moving image by the image pickup unit 2109 (such as a CCD). Since the display portion 2103b is provided in a side of the image pickup unit 2109, a photographic subject can be displayed on the display portion 2103b. Therefore, when the user photographs he or her face by oneself, the user can release the shutter while checking the picture to be photographed on the display portion 2103b in real-time. Accordingly, the dual-emission type panel is convenient.

Figure 10C:
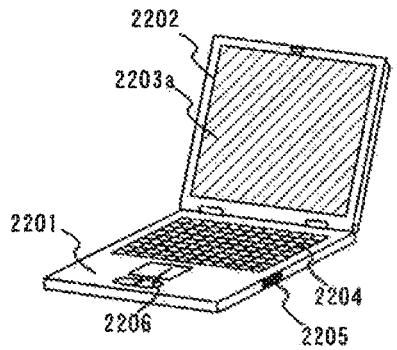
Figure 10D:
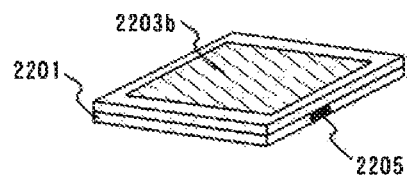

FIG. 10C is a perspective view of a personal laptop computer that is opened, while FIG. 10D is a perspective view of the personal laptop computer that is folded up. The personal laptop computer includes: a main body 2201; a housing 2202; display portions 2203a, 2203b; a keyboard 2204; an external connection port 2205; a pointing mouse 2206; and the like.

The personal laptop computer as shown in FIGS. 10C and 10D comprises the display portion 2203a displaying a high-definition full color image when opening the computer, and the display portion 2203b displaying a high-definition full color image when folding up the computer. Therefore, the user can conveniently recognize an image displayed on the display portion 2203b while carrying the folded laptop computer like an electronic book.

Figure 11A:
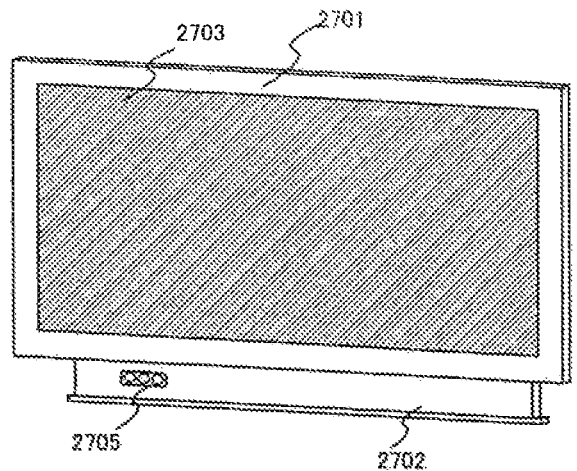
FIGS. 11A to 11C are diagrams showing electronic appliances mounted with light emitting devices according to the invention.

FIG. 11A shows a large-size dual-emission type display device having a large-size screen of 22 to 50 inches. The large-size dual-emission type display includes: a housing 2701; a support base 2702; a display portion 2703; a video input terminal 2705; and the like. Note that the display device includes all display devices for displaying information such as one for a personal computer, one for receiving TV broadcasting, and one for an interactive TV. According to the invention, a large-size, thin, lightweight display device with a large-size screen, that is capable of pure black display and high-definition full color display, can be achieved.

Figure 11B:
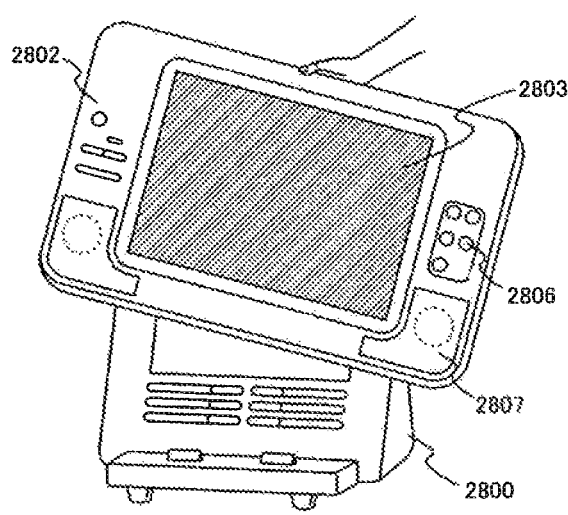

FIG. 11B shows a wireless portable TV. A housing 2802 has a built-in battery and a built-in signal receiver, and a display portion 2604 and speaker units 2807 are driven by the built-in battery. The buttery can be recharged repeatedly by a battery charger 2800. The battery charger 2800 can transmit and receive an image signal, and transmit an image signal to the signal receiver of the housing. The housing 2802 is controlled by operation keys 2806. Since the housing 2802 can transmit a signal to the battery charger 2800 by operating the operation keys 2806, the device as shown in FIG. 11B can serve as a bi-directional video-audio communication device. Further, by operating the operation key 2806, a signal is transmitted to the battery charger 2800 from the housing 2802, and the signal received by the battery charger is further transmitted to other electronic appliance so that communication control of the other electronic appliance can be carried out. Accordingly, the device as shown in FIG. 11B can also serve as a general-purpose remote-control device. According to the invention, a relatively large-size wireless portable TV (22 to 50 inches) with a dual-emission type panel can be achieved.

Figure 11C:
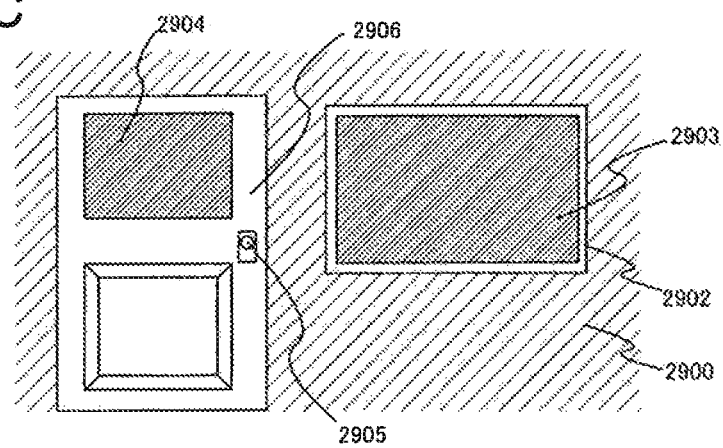

FIG. 11C shows examples in which dual-emission type display devices are mounted on an exterior wall 2900 and a door 2906 of a shop or building such as a restaurant and a closing store. For example, when the dual-emission type display device is embedded in a frame 2902 of the exterior wall 2900 facing the street, like a window, both ones outside and inside of the building can see information (e.g., advertisement information) displayed on a display portion 2903, simultaneously. Therefore, using the dual-emission type display device makes it possible to serve as a store window for providing merchandise information to more people, namely, not only ones outside the shop but also ones inside the shop. The power consumption for only one panel is required even when displaying images on both display screens. In addition, advertisement information can be confirmed in a wide area around the display screens, and hence, the dual-emission type display device is useful.

Similarly, when a dual-emission type display device is mounted on the door 2906 as a display portion 2904, the display device can serve as a show window. Because of using the dual-emission type display device, images displayed on the display portion can be seen in both cases where the door 2906 is closed and the door is fully opened, in which the display portion 2904 is turned inside out. Reference numeral 2905 represents a handle. When the dual-emission type display device is placed a signboard, advertisement information can be seen and confirmed in a wide area around the display screens, and hence, it is useful.

The embodiment can be freely combined with Embodiment Mode 1, Embodiment Mode 2, or Embodiment 1.

According to the present invention, when two substrates are attached to each other to encapsulate a light emitting element, pressure applied to the substrates can be dispersed to prevent cracking of the substrates, thereby improving the yield.

What is claimed is:

1. A light-emitting device comprising:
a first substrate and a second substrate;
a pixel portion comprising a light-emitting element and a transistor;
a gate signal line driver circuit electrically connected to the pixel portion;
a sealing material with a closed pattern between the first substrate and the second substrate; and
an organic material layer,
wherein the pixel portion and the gate signal line driver circuit are provided inside of a region surrounded by the sealing material, and
wherein the organic material layer is provided outside of the region surrounded by the sealing material.

2. The light-emitting device according to claim 1, further comprising a polarizing plate over the second substrate.

3. The light-emitting device according to claim 1, wherein the light-emitting device is configured to emit light from the light-emitting element through the second substrate.

4. The light-emitting device according to claim 1, wherein the light-emitting element comprises a cathode, an anode, and a layer containing an organic compound between the cathode and the anode.

5. The light-emitting device according to claim 1,
wherein the organic material layer is included in a structure, and
wherein the sealing material and the structure do not overlap each other.

6. The light-emitting device according to claim 1, further comprising a source signal line driver circuit electrically connected to the pixel portion,
wherein the source signal line driver circuit is provided inside of the region surrounded by the sealing material.

7. An electronic appliance comprising the light-emitting device according to claim 1.

8. A head-mounted display comprising the light-emitting device according to claim 1.

9. A light-emitting device comprising:
a first substrate and a second substrate;
a pixel portion comprising a light-emitting element and a transistor;
a gate signal line driver circuit electrically connected to the pixel portion;
a sealing material with a closed pattern between the first substrate and the second substrate;
an organic material layer; and
a flexible printed circuit attached to the first substrate,
wherein the pixel portion and the gate signal line driver circuit are provided inside of a region surrounded by the sealing material,
wherein the organic material layer is provided outside of the region surrounded by the sealing material, and
wherein the organic material layer is provided between the flexible printed circuit and the pixel portion.

10. The light-emitting device according to claim 9, further comprising a polarizing plate over the second substrate.

11. The light-emitting device according to claim 9, wherein the light-emitting device is configured to emit light from the light-emitting element through the second substrate.

12. The light-emitting device according to claim 9, wherein the light-emitting element comprises a cathode, an anode, and a layer containing an organic compound between the cathode and the anode.

13. The light-emitting device according to claim 9,
wherein the organic material layer is included in a structure, and
wherein the sealing material and the structure do not overlap each other.

14. The light-emitting device according to claim 9, further comprising a source signal line driver circuit electrically connected to the pixel portion,
wherein the source signal line driver circuit is provided inside of the region surrounded by the sealing material.

15. An electronic appliance comprising the light-emitting device according to claim 9.

16. A head-mounted display comprising the light-emitting device according to claim 9.

* * * * *